(12) United States Patent
Lin

(10) Patent No.: US 11,636,243 B2
(45) Date of Patent: Apr. 25, 2023

(54) METHOD AND SYSTEM FOR RECORDING INTEGRATED CIRCUIT VERSION

(71) Applicant: REALTEK SEMICONDUCTOR CORP., Hsinchu (TW)

(72) Inventor: Chung-Chang Lin, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 4 days.

(21) Appl. No.: 17/407,378

(22) Filed: Aug. 20, 2021

(65) Prior Publication Data

US 2022/0269843 A1    Aug. 25, 2022

(30) Foreign Application Priority Data

Feb. 19, 2021  (TW) ................. 110105598

(51) Int. Cl.
G06F 30/31 (2020.01)
G06F 30/394 (2020.01)
G06F 30/347 (2020.01)
G06F 30/392 (2020.01)

(52) U.S. Cl.
CPC ........... *G06F 30/31* (2020.01); *G06F 30/347* (2020.01); *G06F 30/392* (2020.01); *G06F 30/394* (2020.01)

(58) Field of Classification Search
CPC ........................................ G06F 30/31
USPC ........................................ 716/117
See application file for complete search history.

(56) References Cited

U.S. PATENT DOCUMENTS 7,386,655 B2    6/2008  Gorobets et al.
2004/0064801 A1*  4/2004  Venkatraman .......... G06F 30/39
                                                         700/121

FOREIGN PATENT DOCUMENTS

TW    I394044 B    4/2013

* cited by examiner

*Primary Examiner* — Eric D Lee
(74) *Attorney, Agent, or Firm* — Li & Cai Intellectual Property (USA) Office

(57) ABSTRACT

A method and a system for recording an integrated circuit version are provided. The method is adapted to a register in an integrated circuit, which includes the following steps: recording the integrated circuit version with N bits, in which N is an integer greater than 1; and amending only a bit value of at least one bit selected from the N bits that have not been used for denoting any past integrated circuit version each time when the integrated circuit is revised.

4 Claims, 2 Drawing Sheets

METHOD AND SYSTEM FOR RECORDING INTEGRATED CIRCUIT VERSION

CROSS-REFERENCE TO RELATED PATENT APPLICATION

This application claims the benefit of priority to Taiwan Patent Application No. 110105598, filed on Feb. 19, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a method and a system for version recording, and more particularly to a method and a system for recording an integrated circuit version.

BACKGROUND OF THE DISCLOSURE

In the process of developing an integrated circuit (IC), the IC is revised frequently for solving problems or modifying functions. At this time, a version recording is performed in the hardware of the IC. For example, a register is usually used to record an IC version.

According to Table 1 below, Table 1 is a data format of how the register records the IC version by a conventional method. For ease of understanding, an "8'h" prefix of bit values indicates that the register uses 8 bits and transforms them into hexadecimal numbers to record the IC version. As shown in Table 1, each time when the IC is revised, the register uses incremental hexadecimal numbers to denote the IC version.

TABLE 1

| IC version | data format used by the register to record the IC version by the conventional method |
|---|---|
| version-1 | 8'h 01 |
| version-2 | 8'h 02 |
| version-3 | 8'h 03 |
| . | . |
| . | . |
| . | . |

Generally, different versions of the IC cooperate with different versions of software or firmware. The software or the firmware identifies the version of the IC by the bit value in the register, and performs a corresponding setting. However, due to a number of reasons, a new version of the IC has to simultaneously meet the requirements below: first, allowing a new version of the software or the firmware to identify the version of the IC (that is, allowing the new version of the software or the firmware to be able to read from the register a bit value which is different from the bits denoting an older version of the IC); and second, being compatible to an old version of the software or the firmware (that is, also allowing the old version of the software or the firmware to be able to read from the register a bit value that denotes the older version of the IC). Therefore, the conventional method of using incremental hexadecimal numbers to denote the IC version is not capable of simultaneously meeting the above requirements.

SUMMARY OF THE DISCLOSURE

In response to the above-referenced technical inadequacy, the present disclosure provides a method for recording an integrated circuit version, which is adapted to a register in an integrated circuit. The method includes the following steps: recording the integrated circuit version with N bits, in which N is a given integer that is greater than 1; and amending a bit value of at least one bit selected from the bits that have not been used for denoting any past integrated circuit version when the integrated circuit is revised.

In another aspect, the present disclosure provides a system for recording an integrated circuit version, which includes a register and a control circuit. The register is arranged in an integrated circuit and is configured to record the integrated circuit version with N bits, in which N is a given integer that is greater than 1. The control circuit is coupled to the register, and is configured to amend a bit value of at least one bit selected from the bits that have not been used for denoting any past integrated circuit version when the integrated circuit is revised.

In certain embodiments, when the integrated circuit is revised, the bit value of a lowest bit of the bits that have not been used to denote any past integrated circuit version.

In certain embodiments, initial bit values of the N bits are a first bit value; when the bit value of at least a first bit of the N bits is set as a second bit value for denoting a first version of the integrated circuit version, and the at least one bit that has not been used for denoting any past integrated circuit version is at least a second bit that is still with the first bit value.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
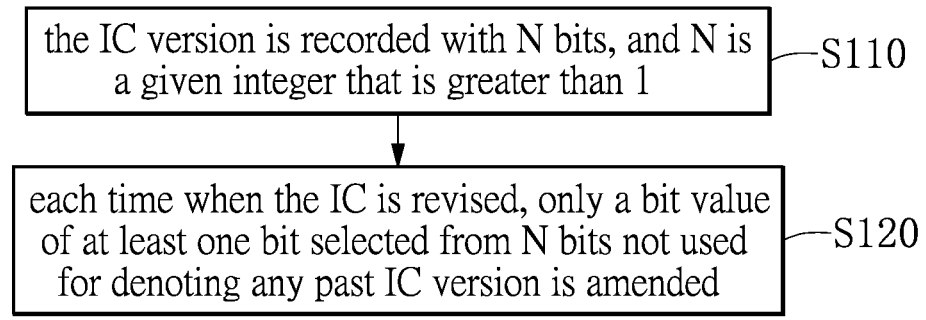
FIG. 1 is a flowchart of a method for recording an integrated circuit version according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, FIG. 1 is a flowchart of a method for recording an integrated circuit version according to an embodiment of the present disclosure. The method of FIG. 1 is suitable for any register of an IC. That is, an implementation of the IC is not limited by the present disclosure. As shown in FIG. 1, in step S110, the integrated circuit version is recorded with N bits, in which N is a given integer that is greater than 1. In step S120, only a bit value of at least one bit selected from the bits that have not been used for denoting any past integrated circuit version is amended each time when the integrated circuit is revised.

Reference is made to Table 2. Table 2 is a data format of how the register records the IC version by the method of FIG. 1. For ease of understanding, the "8'b" prefix of the bit values indicates that the register uses 8 bits and transforms them into binary numbers to record the IC version. Of these 8 bits, a rightmost (also a lowest) bit is bit No. 0, bit[0]. Accordingly, it can be inferred that a leftmost (also a highest) bit is bit No. 7, bit[7].

TABLE 2

| IC version | data format used by the register to record the IC version by the method of FIG. 1 |
|---|---|
| version-1 | 8'b 00000001 |
| version-2 | 8'b 00000011 |
| version-3 | 8'b 00000111 |
| version-4 | 8'b 00001111 |
| version-5 | 8'b 00011111 |
| . | . |
| . | . |
| . | . |

As shown in Table 2, the bit value of every bit may be initialized to 0. The bit value of bit No. 0, bit[0], is set to 1 for denoting a first version, version-1, of the IC in the present embodiment. That is to say, among all of the eight bits from bit[7] to bit[0], when only the bit value of bit No. 0, bit[0], is set to 1 for denoting the first version, version-1, of the IC, the software or the firmware corresponding to the first version, version-1, of the IC may just check bit No. 0, bit[0] to ensure the capacity between the IC and the software or the firmware. Therefore, when the IC is revised from the first version, version-1, to a second version, version-2, only the bit value of bit No. 1, bit[1], which has not been used for denoting any past integrated circuit version needs to be amended in the present embodiment. That is, the bit values of the eight bits from bit[7] to bit[0] are amended from 00000001 to 00000011, so that the second version, version-2, of the IC allows an older version of the software or the firmware to be able to read the same bit value that denotes the older version of the IC in the register, which is the bit value of bit No. 0, bit[0]. In addition, according to the bits from bit No. 1, bit[1], to bit No. 0, bit[0], the software or the firmware corresponding to the second version, version-2, of the IC is able to read a bit value which is different from the bit value that denotes the older version of the IC from the register. In this way, the second version, version-2, of the IC can simultaneously meet requirements of allowing a new version of the software or the firmware to be able to identify the version of the IC.

Similarly, among all of the eight bits from bit[7] to bit[0], only the bit values of bit No. 0, bit[0], and bit No. 1, bit[1], is set to 1 for denoting the second version, version-2, of the IC, the software or the firmware corresponding to the second version, version-2, of the IC may just check from bit No. 1, bit[1], to bit No. 0, bit[0], to ensure the capacity between the IC and the software or the firmware. Therefore, when the IC is revised from the second version, version-2, to a third version, version-3, only the bit value of bit No. 2, bit[2], which has not been used for denoting any past integrated circuit version needs to be amended in the present embodiment. That is, the bit values of the eight bits from bit[7] to bit[0] are amended from 00000011 to 00000111, so that the third version, version-3, of the IC allows an older version of the software or the firmware to be able to read the same bit value that denotes the older version of the IC in the register. Besides, according to the bits from bit No. 2, bit[2], to bit No. 0, bit[0], the software or the firmware corresponding to the third version, version-3, is able to read a bit value which is different from the bit value denotes the older version of the IC in the register. In this way, the third version, version-3, of the IC can also simultaneously meet the requirements of allowing the new version of the software or the firmware to be able to identify the version of the IC.

Accordingly, when the IC is revised from the third version, version-3, to a fourth version, version-4, only the bit value of bit No. 3, bit[3], which has not been used for denoting any past integrated circuit version needs to be amended in the present embodiment. That is, the bit values of the eight bits from bit[7] to bit[0] are amended from 00000111 to 00001111. It can be inferred that when the IC is revised from the fourth version, version-4, to the fifth version, version-5, only the bit value of bit No. 4, bit[4], which has not been used for denoting any past integrated circuit version needs to be amended in the present embodiment. That is, the bit values of the eight bits from bit[7] to bit[0] are amended from 00001111 to 00011111. In this way, every version of the IC meets the requirements of allowing the new version of the software or the firmware to be able to identify the version of the IC, and of being compatible to the old version of the software or the firmware. That is to say, in the present embodiment, each time when the integrated circuit is revised, only a bit value of a lowest bit from the eight bits that have not been used for denoting any past integrated circuit version is amended.

It should be noted that Table 2 is provided only for illustration purposes, and there is no limitation on how the register is configured to record the IC version by the method shown in FIG. 1 in the present disclosure. In other embodiments, bit values of more than one bit, or bit values of a different amount can be amended during every revision of the IC. Furthermore, it is possible to not amend the bit values of bits in an order from a lower bit to a higher bit, but to simply amend the bits that have not been used for denoting any past integrated circuit version. Similarly, every bit may be initialized to 1, and the bit value of bit No. 0, bit[0], is set to 0 for denoting the first version, version-1, of the IC in other embodiments. In other words, when every bit can be initialized to a first bit value (e.g., 0), and when the bit value of at least one first bit of the N bits is set as a second bit value (e.g., 1) for denoting the first version, version-1, of the IC, of the integrated circuit version, the at least one bit which has not been used for denoting any past integrated circuit version is at least a second bit with the first value.

Figure 2:
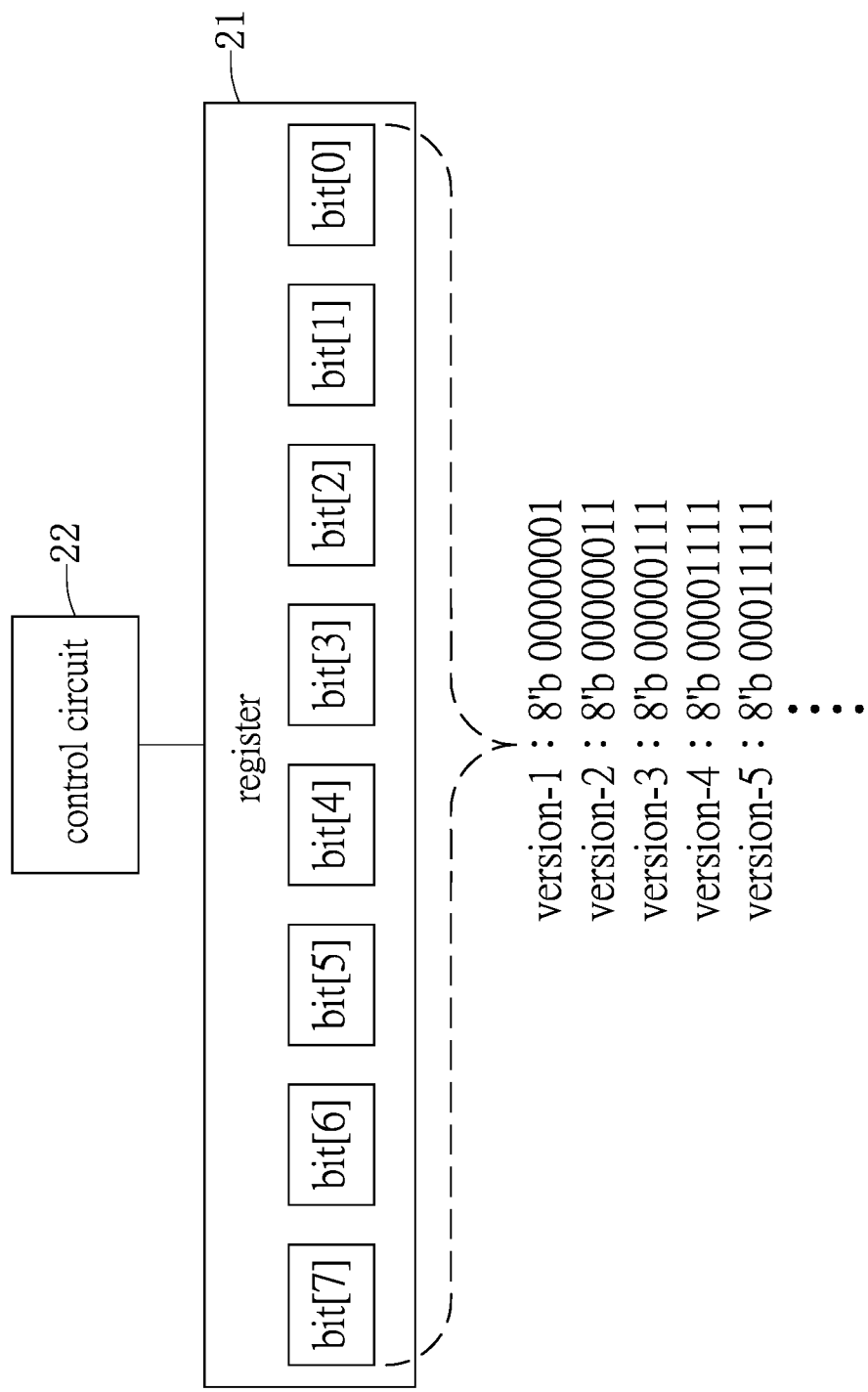
FIG. 2 is a block diagram of a system for recording the integrated circuit version according to the embodiment of the present disclosure.

Reference is made to FIG. 2, which shows a block diagram of a system for recording the integrated circuit version according to the embodiment of the present disclosure. Since the details are as described in the embodiment aforementioned, they will not be reiterated herein. Only an overview will be provided. As shown in FIG. 2, the system for recording the integrated circuit version includes a register 21 and a control circuit 22. The register is arranged in an integrated circuit (not shown in FIG. 2), and is configured to record the integrated circuit version with N bits, in which N is a given integer greater than one. As mentioned above, N is exemplified to be 8 in FIG. 2. That is, the register 21 amends from the bit value of the rightmost bit, bit No. 0, bit[0], to the bit value of the leftmost bit, bit No. 7, bit[7], but the present disclosure does not limit the specific bit value of N. In conclusion, the length of bits whose bit values are amended by the register 21 may be adjusted according to practical requirements or applications. In addition, the control circuit 22 is coupled to the register 21, and is configured to amend only the bit value of at least one bit from the eight bits, bit[7] to bit[0], that have not been used for denoting any past integrated circuit version each time when the integrated circuit is revised.

It should be noted that the control circuit 22 may be implemented by only hardware, or by hardware in cooperation with software or firmware. Further, the register 21 and the control circuit 22 may be integrated together or be arranged separately. In summary, the specific implementation of the control circuit 22 is not limited by the present disclosure. As mentioned above, every bit may be initialized to 0, and the control circuit 22 amends the bit value of bit No. 0, bit[0], to 1 for denoting the first version, version-1, of the IC. However, the present disclosure is not limited thereto. Therefore, when the IC is revised from the first version, version-1, to the second version, version-2, the control circuit 22 may amend only the bit value of bit No. 1, bit[1], that has not been used for denoting any past integrated circuit version. That is, the bit values of the eight bits from bit[7] to bit[0] are amended from 00000001 to 00000011. It can be inferred that when the IC is revised from the fourth version, version-4, to the fifth version, version-5, the control circuit 22 may amend only the bit value of bit No. 4, bit[4], that has not been used for denoting any past integrated circuit version.

Beneficial Effects of the Embodiment

In conclusion, in the method and the system for recording the integrated circuit version provided by the present disclosure, every version of the IC meets the requirements of allowing the new version of the software or the firmware to be able to identify the version of the IC, and of being compatible to the old version of the software or the firmware. That is, the new version of the software or the firmware is able to read from the register a bit value which is different from the bit value that denotes the older version of the IC, and the old version of the software or the firmware is able to read from the register the bit value that denotes the old version of the IC.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for recording an integrated circuit version, which is adapted to a register in an integrated circuit, the method comprising:

recording the integrated circuit version with N bits, wherein a bit value of each of the N bits is initialized to a first value, the first value is 0 or 1, and N is an integer that is greater than 1; and amending only one or more of the bit values that are still the first value among the N bits each time when the integrated circuit is revised.

2. The method according to claim 1, wherein, each time when the integrated circuit is revised, only the bit value of a lowest bit that is still the first value among the N bits is amended.

3. A system for recording an integrated circuit version, comprising:

a register arranged in an integrated circuit, which is configured to record the integrated circuit version with N bits, wherein a bit value of each of the N bits is initialized to a first value, the first value is 0 or 1, and N is an integer that is greater than 1; and a control circuit coupled to the register, which is configured to amend only one or more of the bit values that are still the first value among the N bits each time when the integrated circuit is revised.

4. The system according to claim 3, wherein, each time when the integrated circuit is revised, the control circuit amends only the bit value of a lowest bit that is still the first value among the N bits.

* * * * *